United States Patent
Awais et al.

(10) Patent No.: US 12,029,110 B1
(45) Date of Patent: Jul. 2, 2024

(54) PASSIVATION OF GRAIN BOUNDARIES OF PEROVSKITE FILMS WITH BIPHENYL MOIETIES

(71) Applicant: Solaires Entreprises Inc., Victoria (CA)

(72) Inventors: Muhammad Awais, Victoria (CA); Makhsud Saidaminov, Victoria (CA)

(73) Assignee: Solaires Entreprises Inc. (CA)

( * ) Notice: Subject to any disclaimer, the term of this patent is extended or adjusted under 35 U.S.C. 154(b) by 0 days.

(21) Appl. No.: 18/311,869

(22) Filed: May 3, 2023

(51) Int. Cl.
| | |
|---|---|
| *H10K 85/50* | (2023.01) |
| *B05D 1/00* | (2006.01) |
| *H10K 30/50* | (2023.01) |
| *H10K 30/86* | (2023.01) |
| *H10K 30/88* | (2023.01) |

(52) U.S. Cl.
CPC ........... *H10K 85/50* (2023.02); *B05D 1/005* (2013.01); *H10K 30/50* (2023.02); *H10K 30/86* (2023.02); *H10K 30/88* (2023.02); *B05D 2203/30* (2013.01)

(58) Field of Classification Search
CPC ........ H10K 30/50; H10K 30/86; H10K 30/88; H10K 85/50; B05D 1/005; B05D 2203/30
See application file for complete search history.

(56) References Cited

U.S. PATENT DOCUMENTS

| | | | | |
|---|---|---|---|---|
| 11,903,224 | B1 * | 2/2024 | Khan | ........... H10K 85/211 |
| 2022/0025195 | A1 * | 1/2022 | Huang | ............ H10K 85/50 |
| 2022/0037597 | A1 * | 2/2022 | Palmstrom | ........ H10K 50/135 |

OTHER PUBLICATIONS

Xiaopeng Zheng, Bo Chen, Jun Dai, Yanjun Fang, Yang Bai, Yuze Lin, Haotong Wei, Xiao Cheng Zeng, and Jinsong Huang, Defect passivation in hybrid perovskite solar cells using quaternary ammonium halide anions and cations, Nature Energy 2, 17102. (Year: 2017).*

Haizhou Lu, Anurag Krishna, Shaik M. Zakeeruddin, Michael Gratzel, and Anders Hagfeldt, Compositional and Interface Engineering of Organic-Inorganic Lead Halide Perovskite Solar Cells, iScience 23, 101359. (Year: 2020).*

Ibrahima Ka, Ivy M. Asuo, Riad Nechache, Federico Rose, Highly stable air processed perovskite solar cells by interfacial layer engineering, Chemical Engineering Journal 423 (2021) 130334 (Year: 2021).*

Xiongzhuo Jiang, Shi Chen, Yang Li, Lihua Zhang, Nan Shen, Guoge Zhang, Jun Du, Nianqing Fu, and Baomin Xu, Direct Surface Passivation of Perovskite Film by 4-Fluorophenethylammonium Iodide toward Stable and Efficient Perovskite Solar Cells, ACS Appl. Mater. Interfaces 2021, 13, 2, 2558-2565 (Year: 2021).*

Sawanta S. Mali, Jyoti V. Patil, Dae Woong Park, Young Hee Jung, and Chang Kook Hong, Intrinsic and extrinsic stability of triple-cation perovskite solar cells through synergistic influence of organic additive, Cell Reports Physical Science 3, 100906. (Year: 2022).*

(Continued)

*Primary Examiner* — Mayla Gonzalez Ramos
(74) *Attorney, Agent, or Firm* — Baumgartner Patent Law, LLC; Marc Baumgartner

(57) ABSTRACT

A passivated perovskite film is provided, the passivated perovskite film comprising: a perovskite film, which includes an upper surface and at least one grain boundary; and a biphenyl methyl ammonium halide coating on the upper surface of the perovskite film, wherein the halide is selected from the group consisting of chloride, bromide and iodide.

16 Claims, 9 Drawing Sheets

(56) References Cited

OTHER PUBLICATIONS

Muhammad Awais, Soumya Kundu, Dongyang Zhang, Vishal Yeddu, Mohammad Reza Kokaba, Yameen Ahmed, Wen Zhou, Sergey Dayneko, Furui Tan, Makhsud I. Saidaminov, Selective deactivation of perovskite grain boundaries, Cell Reports Physical Science 4, 101634. (Year: 2023).*

* cited by examiner

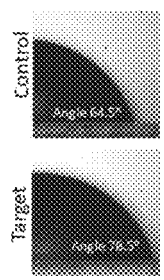
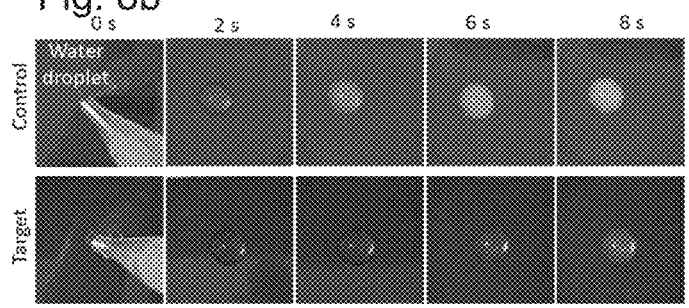
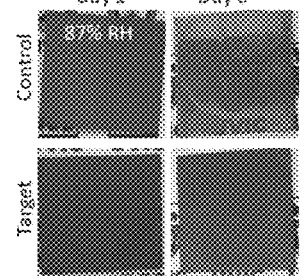
Fig. 8a  Fig. 8b  Fig. 8c
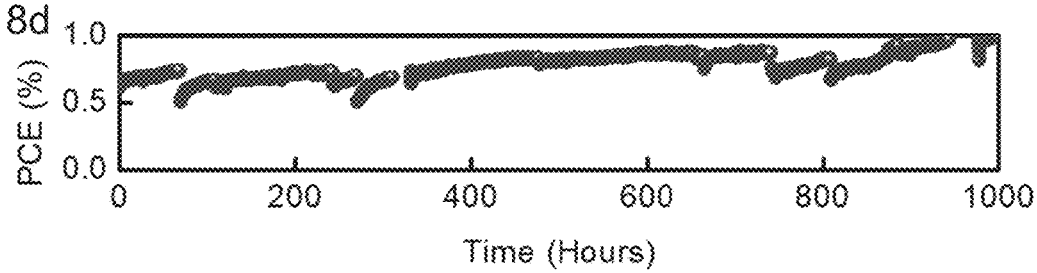
Fig. 8d

PASSIVATION OF GRAIN BOUNDARIES OF PEROVSKITE FILMS WITH BIPHENYL MOIETIES

FIELD

The present technology is directed to improving the stability of perovskite photovoltaic cells by stabilizing the grain boundaries. More specifically it is a method to passivate the interface between the perovskite layer and the hole transport layer using a biphenyl methylammonium iodide (BiPhI) ligand.

BACKGROUND

Perovskite solar cells (PSCs) surpassed 25% power conversion efficiency (PCE) in the lab and are now at the cusp of commercialization. Perovskites provide a range of desirable optoelectronic properties, including bandgap tunability and long charge-carrier lifetime. However, a major challenge in the development of PSCs has been their instability against moisture and oxygen, which can lead to the decay of their performance much faster than the stability standards demand.

It is well established that grain boundaries (GBs) in perovskites are a major source of degradation in PSCs. This is because GBs have a higher density of defects and impurities, and hence are thermodynamically more reactive than non-boundary regions. When PSCs are exposed to stressors such as moisture, light, bias, or high temperature, GBs break first and lead to the overall degradation of the device. For example, water molecules easily deprotonate ammonium cations at interfaces. Similarly, at high operational temperatures, volatile methylammonium ($MA^+$) departs from the perovskite films and etches the electrodes.

Following a gradual move from $MAPbI_3$ to $FAPbI_3$ as a light absorber layer, there has been significant work to improve the stability of PSCs. For example, Seok et al. demonstrated compositional engineering of PSCs and incorporated $MAPbBr_3$ into $FAPbI_3$ to stabilize the perovskite phase. You et al. introduced organic halide salt, phenethylammonium iodide (PEAI), and Huang et al. introduced quaternary ammonium halides for defect passivation or interface engineering. Grätzel et al. tailored the morphology and structure of the perovskite absorber layer by phosphonic acid ammonium additives which act as a cross-linker between neighboring grains.

What is needed is a method to improve the stability of photovoltaic cells. It would be preferable if the defective sites were protected by using protective coatings or by modifying the material itself to reduce or prevent defective site formation. It would be further preferable to selectively passivate grain boundaries in photovoltaic cells.

SUMMARY

The present technology is a method to improve the stability of photovoltaic cells. The defective sites in the grain boundaries are protected by modifying the grain boundaries to reduce or prevent defective site formation. The passivating is selective to the defective grain boundaries in photovoltaic cells. A biphenyl methylammonium halide passivated perovskite layer or film is also provided. A perovskite photovoltaic cell is also provided that include a biphenyl methylammonium iodide (BiPhI) ligand that passivates the interface between the perovskite and hole transport layer (HTL).

In one embodiment, a passivated perovskite film is provided, the passivated perovskite film comprising: a perovskite film, which includes an upper surface and at least one grain boundary; and a biphenyl methyl ammonium halide coating on the upper surface of the perovskite film, wherein the halide is selected from the group consisting of chloride, bromide and iodide.

In the passivated perovskite film, the halide may be iodide.

In the passivated perovskite film, the biphenyl methyl ammonium iodide coating may be a spin coating.

In the passivated perovskite film, the spin coating may be between 0.008 milligrams to 0.08 milligrams biphenyl methyl ammonium iodide per square centimeter of the upper surface of the perovskite film.

In the passivated perovskite film, the spin coating may be 0.032 milligrams biphenyl methyl ammonium iodide per square centimeter of the upper surface of the perovskite film.

In the passivated perovskite film, biphenyl methyl ammonium iodide may be mainly confined to the grain boundaries.

In another embodiment, a method of passivating a perovskite film is provided, the method comprising: preparing a biphenyl methyl ammonium halide solution, wherein the biphenyl methyl ammonium halide solution comprises one of biphenyl methyl ammonium chloride, biphenyl methyl ammonium iodide or biphenyl methyl ammonium bromide in absolute isopropyl alcohol; and coating the perovskite film with the biphenyl methyl ammonium halide solution.

The method may further comprise selecting biphenyl methyl ammonium iodide as the biphenyl methyl ammonium halide.

In the method, the coating may provide a layer comprising 0.008 milligrams to 0.08 milligrams biphenyl methyl ammonium iodide per square centimeter.

In the method, the coating may provide a layer comprising 0.032 milligrams biphenyl methyl ammonium iodide per square centimeter.

In the method, the coating is spin coating.

In another embodiment, a passivated photovoltaic device is provided, the photovoltaic device comprising: a substrate; an electron transporter layer; a perovskite film on the substrate, wherein the perovskite film includes an upper surface; a biphenyl methyl ammonium halide coating on the perovskite film; a hole transfer layer on the biphenyl methyl ammonium halide coating; and an electrode.

In the passivated photovoltaic device, the biphenyl methyl ammonium halide may be biphenyl methyl ammonium iodide.

In the passivated photovoltaic device, the biphenyl methyl ammonium iodide coating is a spin coating.

In the passivated photovoltaic device, the spin coating may be between 0.008 milligrams to 0.08 milligrams biphenyl methyl ammonium iodide per square centimeter of the upper surface of the perovskite film.

In the passivated photovoltaic device, the spin coating may be 0.032 milligrams biphenyl methyl ammonium iodide per square centimeter of the upper surface of the perovskite film.

BRIEF DESCRIPTION OF THE DRAWINGS

FIG. 1a shows Power conversion efficiency; FIG. 1b shows Fill Factor; FIG. 1c shows Open-circuit Voltage ($V_{oc}$); and FIG. 1d shows Short-circuit Current ($J_{sc}$). The lines indicate the distribution of results, with the top and bottom limits being the highest and the lowest values, respectively.

FIG. 2a shows Control and BiPhCl treated films (layers); FIG. 2b shows Control and BiPhBr treated films; FIG. 2c shows Control and BiPhI treated films; and FIG. 2d shows BiPhI powder.

FIG. 3a shows Power conversion efficiency; FIG. 3b shows Fill Factor; FIG. 3c shows Open-circuit Voltage ($V_{oc}$); and FIG. 3d shows Short-circuit Current ($J_{sc}$). The lines indicate the distribution of results, with the top and bottom limits being the highest and the lowest values, respectively.

FIG. 4a shows Power conversion efficiency; FIG. 4b shows Fill Factor;

FIG. 4c shows Open-circuit Voltage ($V_{oc}$); and FIG. 4d shows Short-circuit Current ($J_{sc}$). The lines indicate the distribution of results, with the top and bottom limits being the highest and the lowest values, respectively.

FIG. 5a shows Power Conversion Efficiency (PCE); FIG. 5b shows open-circuit Voltage (Voc); and FIG. 5c shows the JV curve. The boxes indicate the 25th and 75th percentiles. The whiskers indicate the 5th and 95th percentiles. The median and mean are represented by the line dividing the boxes and the open square symbols, respectively. The cross symbols represent the maximum and minimum values.

FIG. 6a shows XRD; FIG. 6b shows steady-state photoluminence; FIG. 6c shows time-resolved photoluminescence; FIG. 6d is a photograph showing scanning electron microscope (SEM) images of the control.

FIGS. 8a-d are photographs showing stability of the BiPHI passivated perovskite layer and the unpassivated perovskite layer. FIG. 8a shows the contact angle measurement;

FIG. 8b shows stability in water; FIG. 8c shows stability in water vapour; FIG. 8d shows the operational stability of BiPHI passivated perovskite device.

DESCRIPTION

Figure 1A:
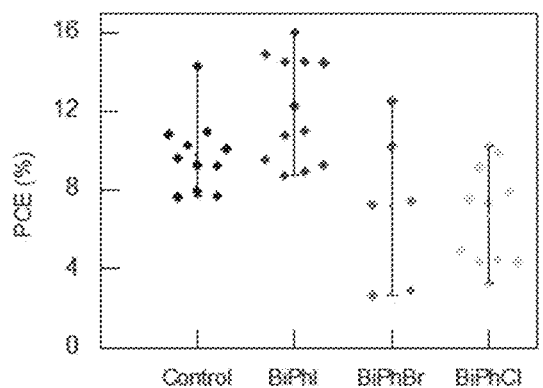
FIGS. 1a-d show optimization of devices based on different passivation molecules.
Figure 1B:
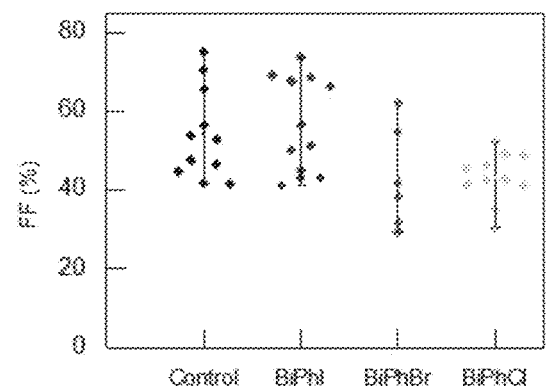
Figure 1C:
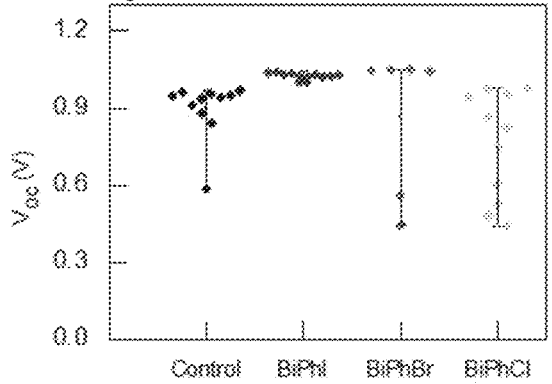
Figure 1D:
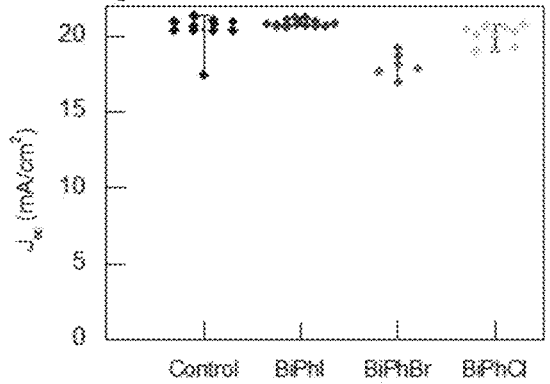

Except as otherwise expressly provided, the following rules of interpretation apply to this specification (written description and claims): (a) all words used herein shall be construed to be of such gender or number (singular or plural) as the circumstances require; (b) the singular terms "a", "an", and "the", as used in the specification and the appended claims include plural references unless the context clearly dictates otherwise; (c) the antecedent term "about" applied to a recited range or value denotes an approximation within the deviation in the range or value known or expected in the art from the measurements method; (d) the words "herein", "hereby". "hereof". "hereto", "hereinbefore", and "hereinafter", and words of similar import, refer to this specification in its entirety and not to any particular paragraph, claim or other subdivision, unless otherwise specified; (e) descriptive headings are for convenience only and shall not control or affect the meaning or construction of any part of the specification; and (f) "or" and "any" are not exclusive and "include" and "including" are not limiting. Further, the terms "comprising," "having," "including." and "containing" are to be construed as open-ended terms (i.e., meaning "including, but not limited to,") unless otherwise noted.

Recitation of ranges of values herein are merely intended to serve as a shorthand method of referring individually to each separate value falling within the range, unless otherwise indicated herein, and each separate value is incorporated into the specification as if it were individually recited herein. Where a specific range of values is provided, it is understood that each intervening value, to the tenth of the unit of the lower limit unless the context clearly dictates otherwise, between the upper and lower limit of that range and any other stated or intervening value in that stated range, is included therein. All smaller sub ranges are also included. The upper and lower limits of these smaller ranges are also included therein, subject to any specifically excluded limit in the stated range.

Unless defined otherwise, all technical and scientific terms used herein have the same meaning as commonly understood by one of ordinary skill in the relevant art. Although any methods and materials similar or equivalent to those described herein can also be used, the acceptable methods and materials are now described.

Strengthening the surface and grain boundaries of perovskite films is important to improve the efficiency and stability of the devices. The passivation of the perovskite and hole-transport layer interface with biphenyl-containing moieties offers high density of electron cloud for selective passivation of grain boundaries. This leads to extended charge carrier lifetime from 1 us to 2.7 microseconds (μs). The hydrophobic nature of the benzene ring improves the stability of the perovskite layer in direct contact with water by a factor of 3. The devices, all fabricated in ambient air, showed significantly improved reproducibility (17-21% efficiency) and increased open-circuit voltage of over 1 V.

A biphenyl methylammonium halide (BiPhX, where X is Cl, Br or I) was used as a passivation layer. The effect of BiPhX passivation was studied on planar perovskite solar cells with an architecture of substrate, electron transport layer perovskite layer, passivation layer and hole transport layer of glass/ITO/$SnO_2$/perovskite ($FA_{0.95}MA_{0.05}PbI_{2.85}Br_{0.15}$)/BiPhX/spiro-OMeTAD/Au.

The effect of different counter ions to biphenyl methylammonium cation on perovskite photovoltaic performance is shown in FIG. 1. Iodine, bromine and chlorine (referred to as BiPhI, BiPhBr and BiPhCl, respectively) salts of BiPhX were dissolved in anhydrous 2-propanol in 2 mg ml$^{-1}$ concentration, and 0.1 milliliter was spin-coated on top of perovskite films (all made in ambient air). The coating was between 0.008 milligrams per square centimeter to 0.08 milligrams per square centimeter (0.05 milligrams per milliliter to 0.5 milligrams per milliliter). The performance of solar cells showed that the BiPhI-treated films had better photovoltaic performance than the control, BiPhBr- and BiPhCl-treated films in terms of power conversion efficiency as shown in FIG. 1a, fill factor as shown in FIG. 1b, open-circuit voltage ($V_{oc}$) as shown in FIG. 1c and short-circuit current ($J_{sc}$) as shown in FIG. 1d.

Figure 2A:
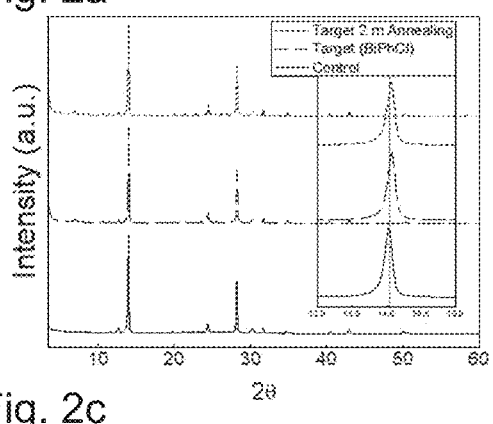
FIGS. 2a-d show XRD patterns.
Figure 2B:
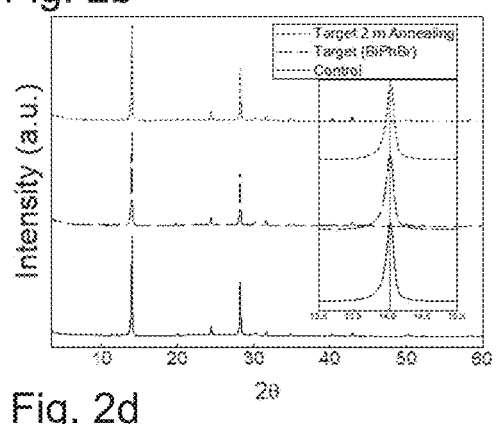
Figure 2C:
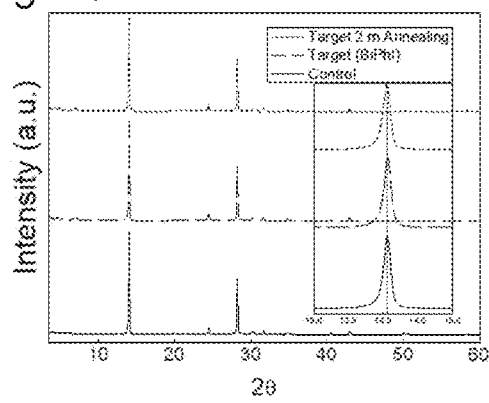

X-ray diffraction (XRD) analysis revealed that, as shown in FIG. 2a and FIG. 2b, respectively, BiPhCl and BiPhBr led to shifts in diffraction peak which is indicative of halide exchange and/or structural strain in the perovskite layer after passivation. In contrast, as shown in FIG. 2c, BiPhI-treated films show no observable changes on perovskite diffraction pattern indicating intact perovskite structure. Therefore, BiPhI was chosen as a candidate for surface passivation.

Figure 3A:
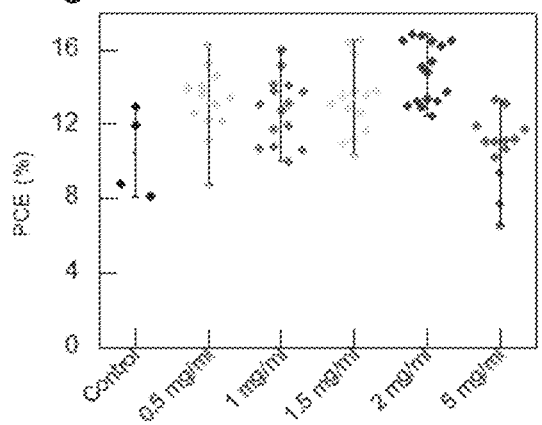
FIGS. 3a-d show optimization of devices based on varying concentration of BiPhI.
Figure 3B:
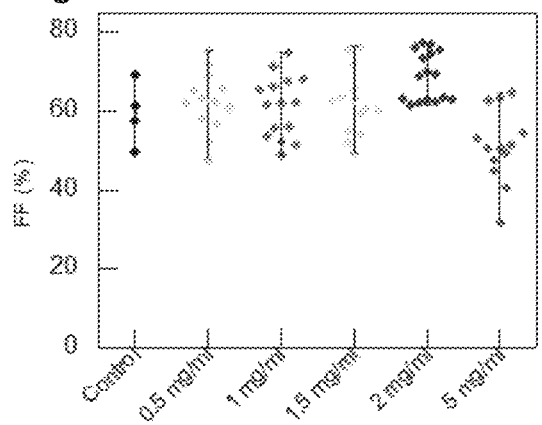
Figure 3C:
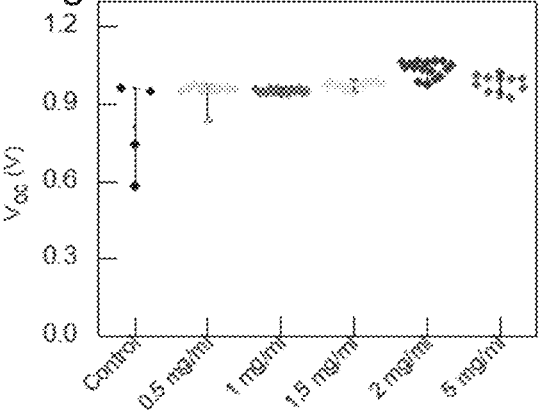
Figure 3D:
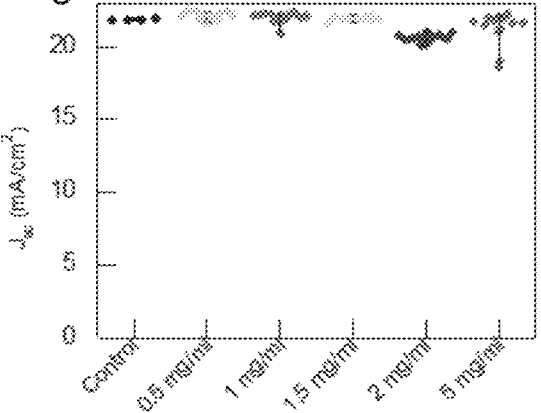
Figure 4A:
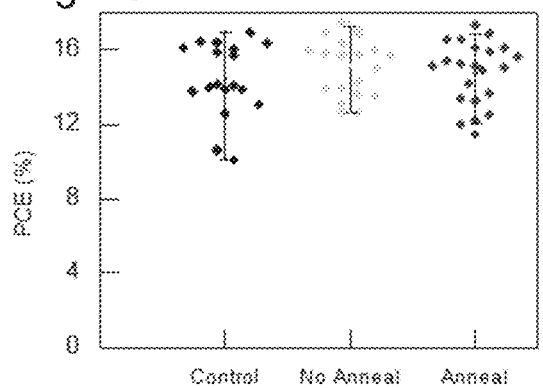
FIGS. 4a-d show optimization of devices based on annealing and no annealing of after depositing BiPhI.
Figure 4B:
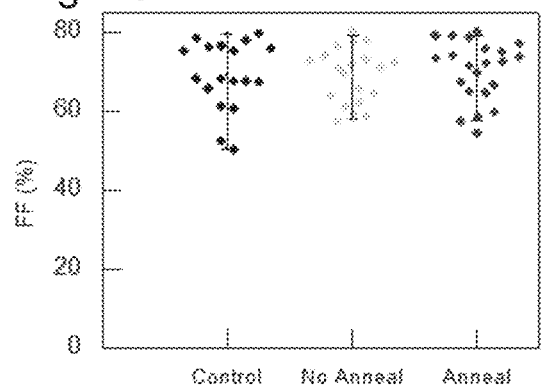
Figure 4C:
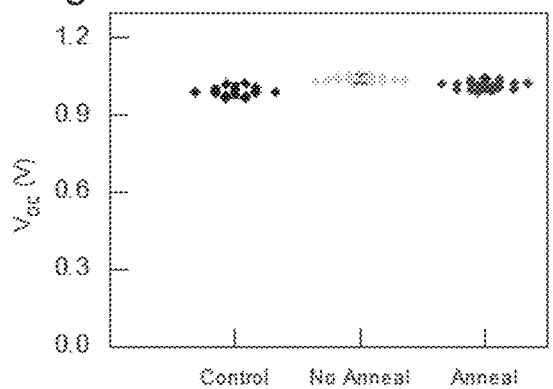
Figure 4D:
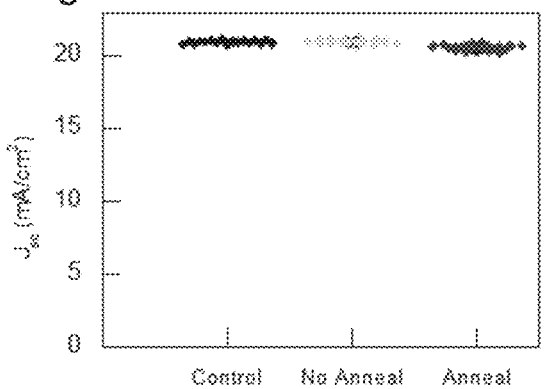

By varying the concentration of BiPhI, it was found that 0.032 milligrams per square centimeter (2 mg ml$^{-1}$) was optimal in terms of power conversion efficiency as shown in FIG. 3a, fill factor as shown in FIG. 3b, open-circuit voltage ($V_{oc}$) as shown in FIG. 3c and short-circuit current ($J_{sc}$) as shown in FIG. 3d. At this optimized concentration, the deposited BiPhI layer on perovskite was thick enough to passivate surface defects, and thin enough to avoid disturbance of charge transport. A further increase in BiPhI concentration resulted in poor device performance (mainly fill factor) due to excessive accumulation of insulating phenyl moieties The effect of post-annealing on device performance is shown in FIGS. 4a-4d. The results show that the unannealed devices after BiPhI deposition perform better than the annealed target devices in terms of p conversion efficiency as shown in FIG. 4a, full factor as shown in FIG. 4b, open-circuit voltage ($V_{oc}$) as shown in FIG. 4c and short-circuit current ($J_{sc}$) 4 s shown in FIG. 4d.

Figure 5A:
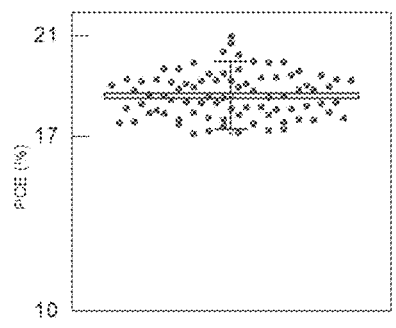
FIGS. 5a-c show statistical data of the BiPhI passivated perovskite solar cells.
Figure 5B:
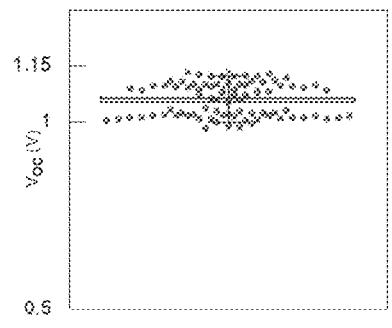
Figure 5C:
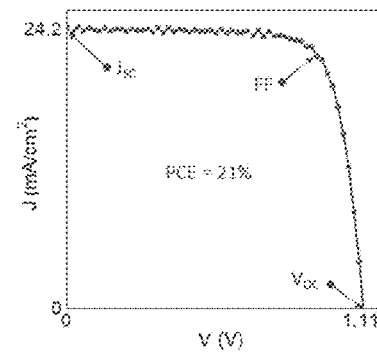

FIGS. 5a-c show the statistical data of 84 fabricated devices modified with optimized parameters for BiPhI (2 mg ml$^{-1}$ concentration and without annealing). FIG. 5a shows Power Conversion Efficiency. As shown in FIG. 5b the data shows the reproducibility of the devices with a consistently enhanced open-circuit voltage of more than 1 V. FIG. 5c shows the JV curve of the BiPhI passivated device with 21% power conversion efficiency.

Figure 6A:
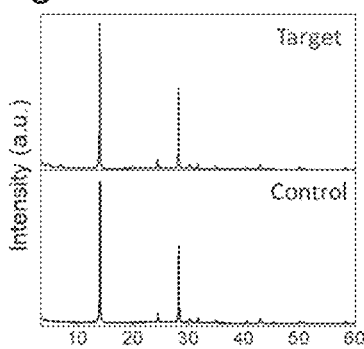
FIGS. 6a-d show characteristics of control and BiPhI passivated perovskite layers (target refers to BiPhI passivated perovskite layer).
Figure 6B:
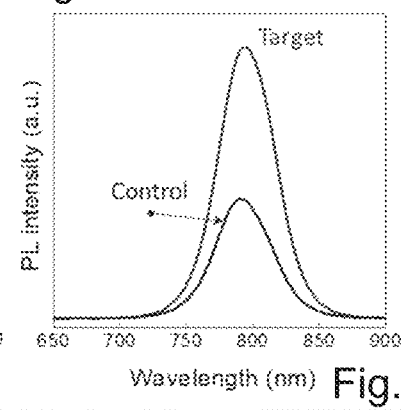
Figure 6C:
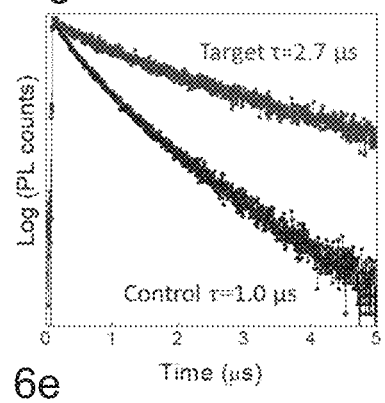

As shown in FIGS. 6b-c, to probe the origin of increase in the $V_{oc}$, steady photoluminescence (PL) of both target (BiPhI passivated perovskite layer/film) and control perovskite films. FIG. 6b shows steady-state photoluminence and FIG. 6c shows time-resolved photoluminescence. The PL intensity for the target film was nearly double that of the control. The PL lifetime of the perovskite film significantly increased from 1.0 us to 2.7 us after film treatment with BiPhI. This increase in PL intensity and carrier lifetime implies a significant reduction in the carrier losses, hence, increasing the $V_{oc}$.

Figure 6D:
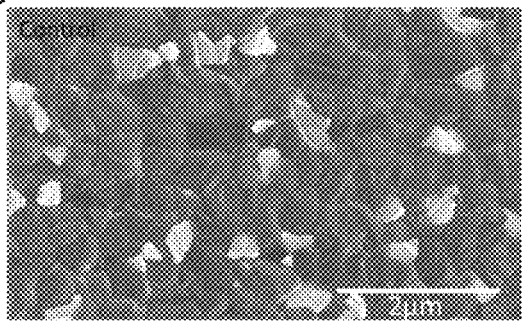
Figure 6E:
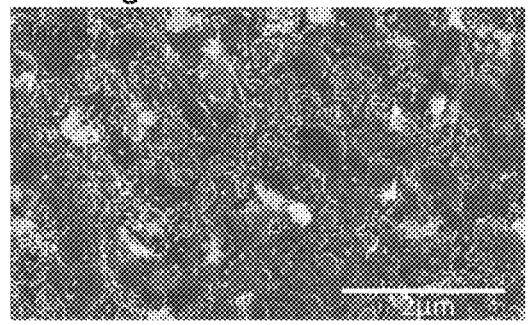
FIG. 6e is a photograph showing SEM images of the BiPhI passivated perovskite layer.

FIG. 6d shows the surface image of the perovskite film control where unreacted PbI$_2$ (white grains) is present. As shown in FIG. 6e, after treatment with BiPhI less PbI$_2$ was observed. Also seen in FIG. 6e is that the BiPhI mainly resides on the grain boundaries. Without being bound to theory, this likely due to high electron cloud density of phenyl rings which tend to interact with defective sites. In the meantime, the surface of perovskite grains remains intact which enables more intimate interaction with the hole transporter layer. It is in accordance with the XRD spectra of FIG. 6a in which perovskite peak of the target film remains identical after BiPhI treatment.

Figure 2D:
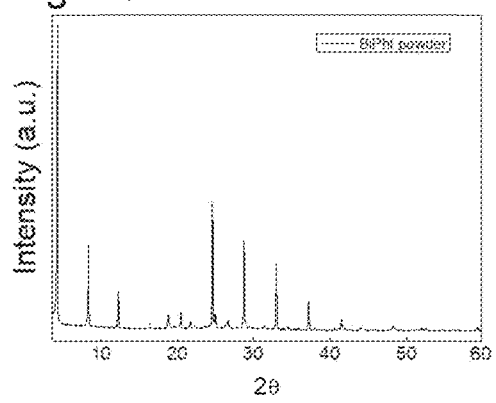
Figure 7:
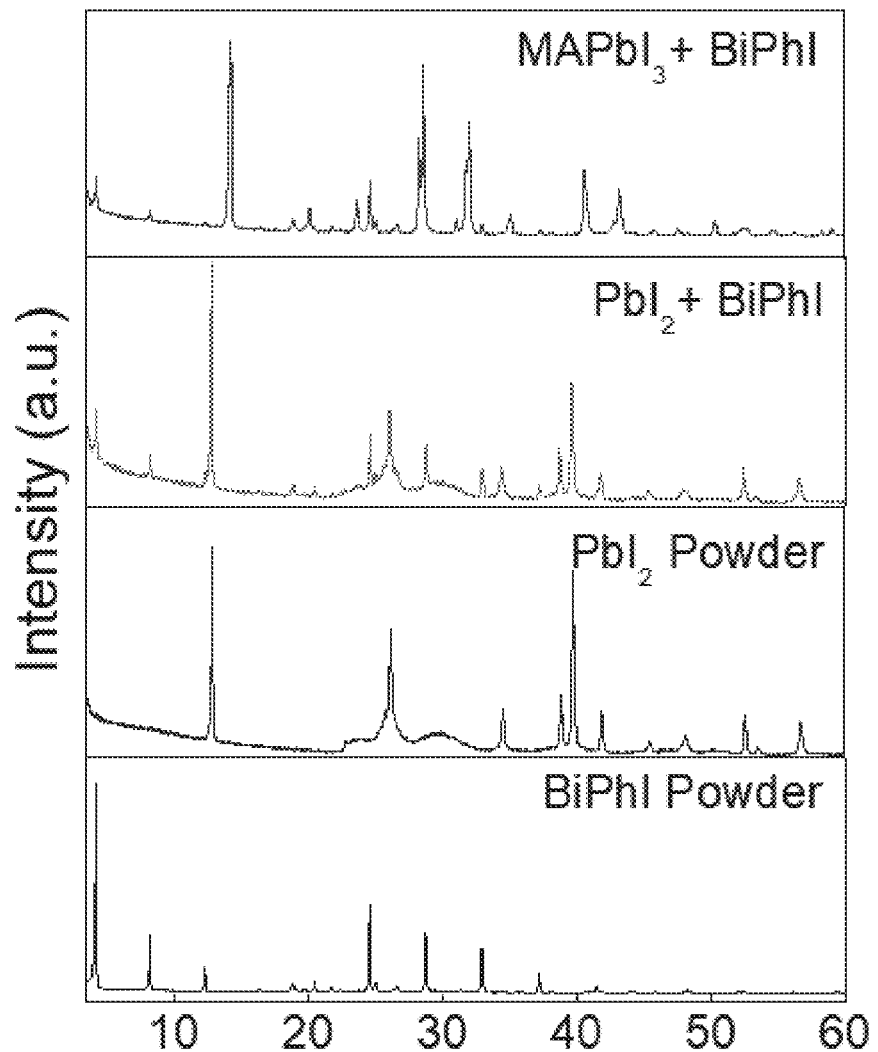
FIG. 7 shows XRD patterns of BiPhI powder, $PbI_2$ powder, $PbI_2$ and BiPhI powder, $MAPbI_3$ and BiPhI powder.

To confirm the presence of BiPhI on the perovskite layer, X-ray diffraction (XRD) was carried out on both a perovskite film control and a BiPhI passivated perovskite layer. FIG. 7 shows the XRD spectra with a sharp perovskite peak at ~14.2° in both films. However, a new peak at a diffraction angle of 4.7° was observed in the XRD spectra of the BiPhI passivated perovskite layer which is consistent with the diffraction pattern for BiPhI powder, as shown in FIG. 2d. XRD for BiPhI mixed with PbI$_2$ showed a new peak in PbI$_2$ and BiPhI powder at ~4.7° which is in consistent with the XRD of BiPhI powder.

As shown in FIGS. 8a and 8d, a contact angle measurement was conducted and it was observed that the control perovskite film has a sharper angle to water droplet than the BiPhI perovskite film indicating the resistance of BiPhI perovskite film's surface to water/moisture. FIG. 8b shows water mediated degradation of the BiPhI perovskite film and the control perovskite film. The control film showed an obvious sign of degradation in less than seconds; however, the BiPhI perovskite film showed resistance to water and degraded in at least 3× longer time. As shown in FIG. 8c, both BiPhI perovskite film and perovskite film (control) were placed in a container having 87% relative humidity (RH). There was significant discoloration of the control film after 6 days under 87% RH, while the target BiPhI perovskite film remained almost intact within this period. As shown in FIG. 8e, the stability of the BiPhI perovskite containing device at maximum power was stable for the 1000 hours that measurements were taken. The BiPhI perovskite containing device showed a burn in time but was then stable.

Figure 9:
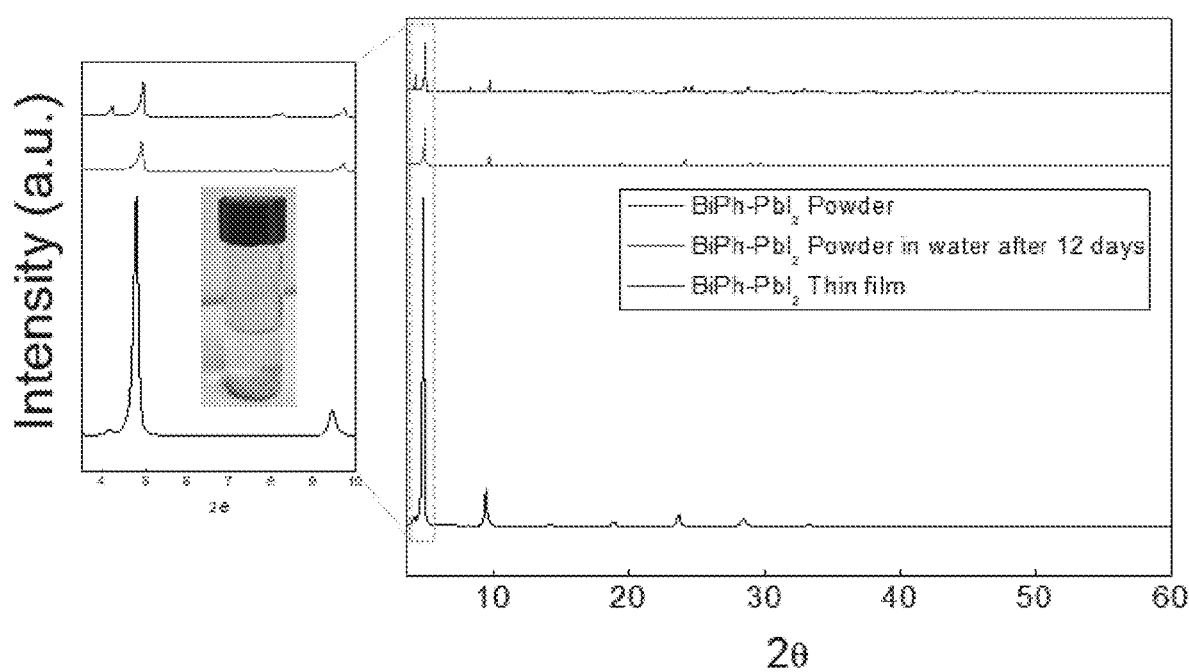
FIG. 9 is a photograph of XRD patterns of BiPhI—$PbI_2$ powder, BiPhI—$PbI_2$ powder in water after 12 days and BiPhI—$PbI_2$ thin film.

As shown in FIG. 9 and FIG. 9 inset, biphenyl methylammonium lead iodide crystals (BiPh-PbI$_2$) was synthesized from BiPhI and PbI$_2$ in hydroiodide acid (HI) and the XRD assessed. After placing them in water for 12 days, the XRD was again assessed. There was no dissolution. The powder was extracted and dried and XRD was again assessed. The diffraction pattern was essentially identical to the biphenyl methylammonium lead iodide crystals prior to the water treatment, except for a minor presence of BiPhI. FIG. 9 also shows BiPh-PbI2 film made by spin coating BiPhI and PbI2 solution. The main characteristic peaks match the peaks obtained from crystals. This indicates that the crystals and the film are made of the same materials. These results suggest that the perovskite made with BiPhI is highly insoluble in water.

In summary, a BiPhI ligand was synthesized and employed to improve the PCE and stability of the PSCs. Without being bound to theory, the presence of double benzene rings enabled strong passivation of the defects and increased the hydrophobicity of the surfaces. The results show that BiPhI resided on grain boundaries and reduced the degradation of PSCs. Time-Resolved Photoluminescence (TRPL) results showed the increased lifetime of treated perovskite films from 1.0 to 2.7 us implying the suppression of non-radiative recombination resulting in increased $V_{oc}$. With this modification, the perovskite film was stable at 87% RH for 6 days and a power conversion efficiency of 21% was achieved. Moreover, the devices treated with BiPhI were stable at maximum power point for 1,000 hours retaining >90% of their initial efficiency. Our work provides a roadmap for rationally synthesizing new passivation materials for increased stability of the perovskite solar cells.

MATERIALS AND METHODS

Materials

Indium tin oxide (ITO) coated glass substrates were purchased from Shang Yang Solar® (X07-10A). Tin (IV) oxide (SnO$_2$) 15% in H$_2$O colloidal dispersion solution was purchased from the Alfa Aesar®. Formamidinium iodide (FAI, >99.99%), methylammonium chloride (MACl, >99.99%), and methylammonium bromide (MABr, >99.99%) were purchased from Great Cell®, lead(II) iodide (PbI$_2$, 99.99%) from TCI Chemicals®, and lead bromide (PbBr$_2$) was purchased from Alfa Aesar® as perovskite precursors. N, N-dimethyl formamide (DMF, 99.5%), dimethylsulfoxide (DMSO, 99.5%), chlorobenzene (99.5%), and acetonitrile (ACN, ≥99.9%) solvents were parched from Milipore Sigma®. Sprio-OMeTAD was purchased from Xi'an Polymer Light Technology Co.®, Ltd. Bis(trifluoromethane)sulfonimide lithium salt (Li-TFSI 99.95%), 4-tert-Butylpyridine (tBP, 98%) and cobalt salt (FK 209 Co(III) TFSI) were purchased from Milipore Sigma®.

Synthesis of BiPhMAI:

BiPhMAI was synthesized by the following standard procedure. 15 g of 4-Phenylbenzylamine was added to a 250 mL round bottom flask and put in an ice bath. 50 mL of 95% ethanol was then added to the flask. Then 7.4 mL of HI solution was added slowly over 30 minutes using a dripping funnel while under continuous stirring. After complete addition, the mixture was stirred for another 2 h to maximize the yield. The solvent was then evaporated, and the resulting solid was dissolved in a minimum amount of boiling ethanol. After complete dissolution, the solution was left undisturbed overnight for crystallization. The white BiPhMAI solid crystals were filtered out and washed with diethyl ether and dried under vacuum for more than 24 hours.

Preparation of Solutions:

A 7 ml solution of $SnO_2$ was prepared by taking 6 ml of deionized (DI) water and 1 ml of $SnO_2$ 15% in $H_2O$ colloidal dispersion nanoparticles with a 6:1 volume ratio. It was sonicated for 30 minutes and filtered with 0.45 μm polyvinylidene difluoride (PVDF) syringe filter before deposition. Perovskite solution based on $(FAPbI_3)_{0.95}(MAPbBr_3)_{0.05}$ was prepared by dissolving 217 mg of FAI, 582.7 mg of $PbI_2$, 7.1 mg of $PbBr_2$, 22 mg of MACl, and 23.3 mg of MABr in 0.8 ml of DMSO and 0.1 ml of DMF. Biphenyliodide solution was prepared by weighing 2 mg of as synthesized BiPhI in 1 ml of anhydrous IPA. Spiro solution was prepared by dissolving 0.1 mg of spiro-OMeTAD powder in 1.1 ml of chlorobenzene, 0.039 ml of tBP. 0.023 ml of Li-TFSI (predissolved in acetonitrile, 540 mg/mL), and 0.01 ml of Co-complex (predissolved in acetonitrile, 376 mg/mL) solution. All the solutions i.e. perovskite, biphenyliodide and spiro-OMeTAD were filtered with 0.22 μm polytetrafluoroethylene (PTFE) syringe filter.

Device Fabrication:

Glass substrates were sonicated with deionized (DI) water, acetone, and isopropanol, respectively, for 15 minutes. Then, they were dried with $N_2$ gas gun and given ozone treatment for ~15 minutes. After that, 0.15 ml of already prepared $SnO_2$ solution was spin-coated at 3000 rpm for 30 seconds. All the films were then thermally annealed at 150° C. for 30 minutes, and again given ozone treatment for 30 minutes. A perovskite solution of ~0.75 ml was spin-coated in a three-step process on top of $SnO_2$ and thermally annealed for 10 minutes for crystallization assisted with dripping of diethyl ether in $3^{rd}$ step. After that, 0.1 ml of a pre-made BiPhI solution was spin coated on the upper surface of cooled perovskite film (6.25 square centimeters) at 5000 rpm for 30 seconds. A 0.075 ml solution of spiro-OMeTAD was deposited with a dynamic spin coating method at 2000 rpm for 30 seconds. A thin layer of ~80 nm of gold was then evaporated on top of the film for front metal connections.

In an alternative embodiment, spin coating is replaced with blade coating. In yet another embodiment, spin coating is replaced with die coating.

Characterization:

Perovskite solar cells were fabricated in the air. X-ray diffraction (XRD) measurements were done with a PANalytical Empyrean system using a Cu (Kα, 1.5406 Å) source. Scanning electron microscopy (SEM) images were obtained with a Hitachi S-4800 FESEM. Photoluminescence (PL) spectroscopy was carried out by UV-Vis AVENTES spectrometer (AvaSpec-ULS2048CL-EVO-RS) in the reflection mode ranging from 500 to 780 nm in a dark room every 2 s. TRPL measurement were performed on an Edinburgh Instruments OB920 Single Photon Counting system. The samples were excited using a 510 nm pulsed laser diode. Emission was collected at 780 nm using a 16 nm bandwidth monochromator. Photovoltaic parameters were measured with Newport Oriel sol-3A (class AAA) solar simulator at standard 1.5 A.M. solar irradiance, and data was recorded with Ossila source meter by scanning the cell from −0.100 V to 1.2 V. Similarly, for operational stability measurements, perovskite solar cells were placed in a self-designed LED simulator, and data was recorded with Ossila source meter with time interval of 15 minutes between each measurement.

While example embodiments have been described in connection with what is presently considered to be an example of a possible most practical and/or suitable embodiment, it is to be understood that the descriptions are not to be limited to the disclosed embodiments, but on the contrary, is intended to cover various modifications and equivalent arrangements included within the spirit and scope of the example embodiment. Those skilled in the art will recognize or be able to ascertain using no more than routine experimentation, many equivalents to the specific example embodiments specifically described herein. Such equivalents are intended to be encompassed in the scope of the claims, if appended hereto or subsequently filed.

The invention claimed is:

1. A passivated perovskite film, the passivated perovskite film comprising: a perovskite film, which includes an upper surface and at least one grain boundary; and a biphenyl methyl ammonium halide coating on the upper surface of the perovskite film, wherein the halide is selected from the group consisting of chloride, bromide and iodide.

2. The passivated perovskite film of claim 1, wherein the halide is iodide.

3. The passivated perovskite film of claim 2, wherein the biphenyl methyl ammonium iodide coating is a spin coating.

4. The passivating perovskite film of claim 3, wherein the spin coating is between 0.008 milligrams to 0.08 milligrams biphenyl methyl ammonium iodide per square centimeter of the upper surface of the perovskite film.

5. The passivated perovskite film of claim 4, wherein the spin coating is 0.032 milligrams biphenyl methyl ammonium iodide per square centimeter of the upper surface of the perovskite film.

6. The passivated perovskite film of claim 5, wherein biphenyl methyl ammonium iodide is located in the grain boundaries.

7. A method of passivating a perovskite film, the method comprising: preparing a biphenyl methyl ammonium halide solution, wherein the biphenyl methyl ammonium halide solution comprises one of biphenyl methyl ammonium chloride, biphenyl methyl ammonium iodide or biphenyl methyl ammonium bromide in absolute isopropyl alcohol; and coating the perovskite film with the biphenyl methyl ammonium halide solution.

8. The method of claim 7, further comprising selecting biphenyl methyl ammonium iodide as the biphenyl methyl ammonium halide.

9. The method of claim 8, wherein the coating provides a layer between 0.008 milligrams to 0.08 milligrams biphenyl methyl ammonium iodide per square centimeter.

10. The method of claim 9, wherein the coating provides the layer of 0.032 milligrams biphenyl methyl ammonium iodide per square centimeter.

11. The method of claim 8, wherein the coating is spin coating.

12. A passivated photovoltaic device, the photovoltaic device comprising: a substrate; an electron transporter layer; a perovskite film on the substrate, wherein the perovskite film includes an upper surface; a biphenyl methyl ammonium halide coating on the perovskite film; a hole transfer layer on the biphenyl methyl ammonium halide coating; and an electrode.

13. The passivated photovoltaic device of claim 12, wherein the biphenyl methyl ammonium halide is biphenyl methyl ammonium iodide.

14. The passivated photovoltaic device of claim 13, wherein the biphenyl methyl ammonium iodide coating is a spin coating.

15. The passivated photovoltaic device of claim 14, wherein the spin coating is between 0.008 milligrams to 0.08 milligrams biphenyl methyl ammonium iodide per square centimeter of the upper surface of the perovskite film.

16. The passivated photovoltaic device of claim 15, wherein the spin coating is 0.032 milligrams biphenyl methyl ammonium iodide per square centimeter of the upper surface of the perovskite film.

\* \* \* \* \*